United States Patent
Hwang et al.

(10) Patent No.: US 9,419,608 B2
(45) Date of Patent: Aug. 16, 2016

(54) ACTIVE DIODE DRIVER

(71) Applicant: MAPS, INC., Yongin-si (KR)

(72) Inventors: Jong-Tae Hwang, Seoul (KR); Hyun-Ick Shin, Seoul (KR); Sang-O Jeon, Suwon-si (KR); Joon Rhee, Seoul (KR)

(73) Assignee: MAPS, INC., Yongin-si (KR)

( * ) Notice: Subject to any disclaimer, the term of this patent is extended or adjusted under 35 U.S.C. 154(b) by 0 days.

(21) Appl. No.: 14/781,360

(22) PCT Filed: Mar. 10, 2014

(86) PCT No.: PCT/KR2014/001965
§ 371 (c)(1),
(2) Date: Sep. 30, 2015

(87) PCT Pub. No.: WO2014/178529
PCT Pub. Date: Nov. 6, 2014

(65) Prior Publication Data
US 2016/0036436 A1    Feb. 4, 2016

(30) Foreign Application Priority Data
Apr. 30, 2013    (KR) .................. 10-2013-0048528

(51) Int. Cl.
| | | |
|---|---|---|
| *H03K 17/687* | (2006.01) | |
| *H03K 17/13* | (2006.01) | |
| *H03K 17/16* | (2006.01) | |
| *H03K 3/012* | (2006.01) | |

(Continued)

(52) U.S. Cl.
CPC .............. *H03K 17/687* (2013.01); *H03K 3/012* (2013.01); *H03K 17/133* (2013.01); *H03K 17/166* (2013.01); *H03K 17/302* (2013.01); *H03K 17/74* (2013.01); *H03K 2017/307* (2013.01)

(58) Field of Classification Search
CPC ............. H03K 17/063; H03K 17/0822; H03K 17/04123
USPC ......... 327/330, 427, 434, 437, 108–112, 493, 327/365, 368, 387, 389, 390, 104; 326/82, 326/83, 87
See application file for complete search history.

(56) References Cited

U.S. PATENT DOCUMENTS

| | | | | |
|---|---|---|---|---|
| 5,506,527 A | * | 4/1996 | Rudolph | .................. G06G 7/62 327/104 |
| 5,991,182 A | | 11/1999 | Novac et al. | |

(Continued)

FOREIGN PATENT DOCUMENTS

| | | |
|---|---|---|
| JP | 2000-502877 A | 3/2000 |
| JP | 2005-295794 A | 10/2005 |

(Continued)

OTHER PUBLICATIONS

International Search Report issued on Jun. 12, 2014 in corresponding International Patent Application No. PCT/KR2014/001965.

*Primary Examiner* — Lincoln Donovan
*Assistant Examiner* — Thomas Skibinski
(74) *Attorney, Agent, or Firm* — NSIP Law

(57) ABSTRACT

An active diode driver for operating a switch of an active rectifier using an active diode is provided. The active diode driver may first control a soft turn-on of the switch and secondly control a hard turn-on of the switch, thereby making it possible for the switch to be softly turned-on.

4 Claims, 13 Drawing Sheets

(51) Int. Cl.
*H03K 17/74* (2006.01)
*H03K 17/30* (2006.01)

(56) References Cited

U.S. PATENT DOCUMENTS

| | | | | |
|---|---|---|---|---|
| 6,469,564 B1 * | 10/2002 | Jansen | ................... | G06G 7/62 327/365 |
| 7,009,314 B2 * | 3/2006 | Chen | ................... | H03K 17/063 307/130 |
| 7,183,834 B2 * | 2/2007 | Nadd | ................... | H02M 1/08 327/404 |
| 7,199,636 B2 | 4/2007 | Oswald et al. | | |
| 7,710,187 B2 * | 5/2010 | Hiyama | ................ | H03K 17/168 326/21 |
| 8,232,830 B2 * | 7/2012 | Takeshita | .............. | H02M 7/217 327/330 |
| 2005/0218964 A1 * | 10/2005 | Oswald | ............... | H02M 3/1588 327/493 |
| 2009/0140707 A1 | 6/2009 | Deboy | | |

FOREIGN PATENT DOCUMENTS

| | | |
|---|---|---|
| JP | 2008-193282 A | 8/2008 |
| KR | 10-2012-0107611 | 10/2012 |

* cited by examiner

ACTIVE DIODE DRIVER

CROSS-REFERENCE TO RELATED APPLICATIONS

This application is a National Stage of International Application No. PCT/KR2014/001965, filed Mar. 10, 2014 and published as WO2014/178529 A1 on Nov. 6, 2014, which claims the benefit of Korean Patent Application No. 10-2013-0048528, filed on Apr. 30, 2013, the entire disclosures of which are incorporated herein by reference for all purposes.

TECHNICAL FIELD

The present invention relates to an active rectifier using an active diode, and more particularly to, technology for operating a switch of an active rectifier.

BACKGROUND ART

FIG. 1 is a diagram illustrating a circuit of an active rectifier using a conventional active diode.

An active rectifier 10 substitutes the conventional bridge diode circuit by using the metal-oxide-semiconductor field-effect transistor (MOSFET), and can reduce a conduction loss by using a MOSFET, thereby being integrated by using IC technology. The active rectifier 10 composed of an active diode 20 is composed of M1, which is a switch of the MOSFET, and due to the characteristics of the MOSFET, a parasitic diode D1 is located between drain and source as illustrated in FIG. 1. A comparator 21 turns on M1 if VKA, which is the voltage between cathode (K) and anode (A) (VKA), is lower than 0 V. Since the comparator 21 cannot provide, for itself, the sufficient current to operate the M1 at a high speed, the comparator 21 operates the M1 by using a gate driver 22 that has the sufficient capability to provide a current.

FIG. 2 is a waveform diagram illustrating an operation when the active diode in FIG. 1 operates.

If a VKA becomes lower than 0, an output of a comparator 21 becomes high, and M1 is turned-on through a gate driver 22. Here, due to the delay time td1+td2 of both the comparator 21 and the gate driver 22, after the VKA becomes lower than zero and td1+td2 passes, the M1 is turned-on. Thus, since a current flows through D1 during the period of td1+td2, the efficiency of the active diode 20 is slightly reduced. Also, electromagnetic interference (EMI) may occur, which is caused by the sudden change of the VKA as the M1 is turned-on.

FIG. 3 is a diagram illustrating an active diode performing a turn-on delay compensation using offset; FIG. 4 is a diagram illustrating an operation waveform in the case the delay compensation using offset is performed; and FIG. 5 is a diagram illustrating a phenomenon that a hard turn-on of M1 is performed when a VKA is greater than 0 and lower than Voff.

FIG. 3 is a case of a comparator 21 being operated by applying an offset. Because the output of the comparator 21 becomes high due to Voff before VKA becomes zero, the point in time when M1 is turned-on is brought to an earlier time after td1+td2 as illustrated in FIG. 4, so as to acquire more ideal characteristics of a diode. However, as in FIG. 5, even when the VKA is greater than 0 and lower than Voff and such a condition is maintained, there may be the phenomenon that the M1 is turned-on so as to reversely turn on an active diode 20. Here, a MOSFET is fully turned-on, thus Rdson being very low, which is the resistance between drain and source, so that a lot of currents may flow. Such a phenomenon may cause a loss that is not made by a normal operation of a diode but by an abnormal operation thereof.

TECHNICAL PROBLEM

The purpose of the present invention is to provide a technical solution to effectively operate a switch used in an active rectifier.

TECHNICAL SOLUTION

An active diode driver to operate a switch of an active rectifier using an active diode according to an exemplary embodiment so as to solve the above-mentioned technical problems first controls a soft turn-on of the switch and secondly controls a hard turn-on of the switch.

The active diode driver first controls a soft turn-on of the switch when the voltage between the opposite ends of a parasitic diode of the switch is close to zero; and the active diode driver secondly controls a hard-turn on of the switch when the voltage between the opposite ends of the parasitic diode reaches zero.

The active diode driver includes: a near zero-cross detector (NZCD) that generates an output signal when the voltage between the opposite ends of the parasitic diode of the switch is close to zero; a zero-cross detector (ZCD) that detects a point in time when the voltage between the opposite ends of the parasitic diode is zero, and generates an output signal; and a gate driver that receives the output signal from the NZCD so as to control a soft turn-on of the switch, and then additionally receives the output signal from the zero-cross detector so as to control a hard turn-on of the switch.

The NZCD generates an output signal when the voltage between the opposite ends of the parasitic diode is lower than the trigger voltage of the NZCD.

The NZCD includes a second switch that, if a threshold voltage is the same as the trigger voltage and a gate voltage is lower than the threshold voltage, is turned off so as to increase a drain voltage and generate an output signal.

ADVANTAGEOUS EFFECTS

The active driver according to the present invention controls a gate operation voltage in dual steps by using a NZCD and an existing ZCD, thereby naturally turning on the switch of the active rectifier to reduce the conduction loss, enhance electromagnetic interference (EMI), and acquire efficiency not to flow an overcurrent even when a voltage of the active diode is maintained near zero.

DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

BEST MODE

The above-mentioned and additional aspects of the present invention may be clearer through preferred embodiments, which are described with reference to attached figures. Hereinafter, the present invention is specifically described so as to help those skilled in the art easily understand and implement the present invention through these exemplary embodiments.

Figure 6:
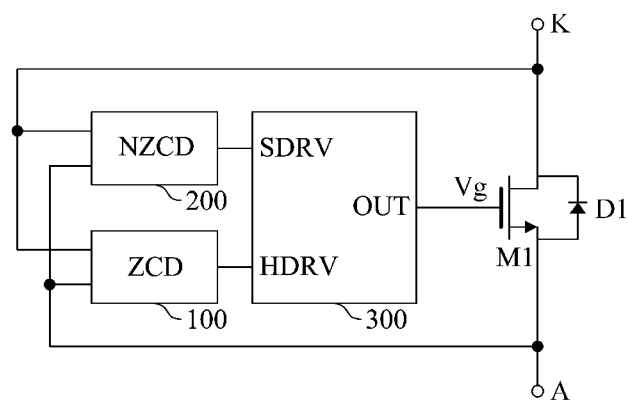
FIG. 6 is a diagram illustrating an active diode driver circuit for the control of MOSFET turn-on according to an exemplary embodiment of the present invention.
Figure 7:
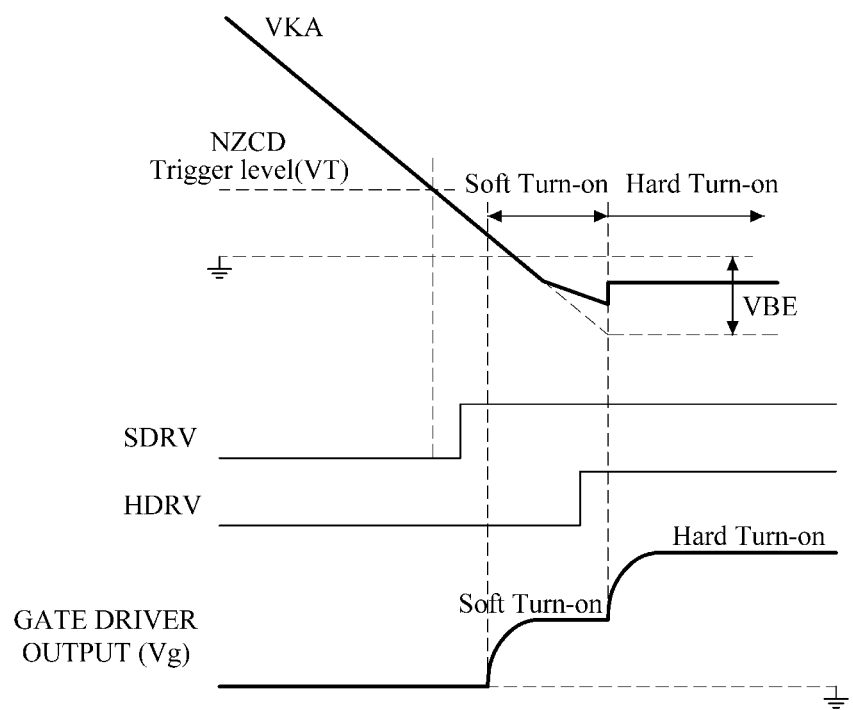
FIG. 7 is a diagram illustrating MOSFET soft turn-on performed by the circuit in FIG. 6.

FIG. 6 is a diagram illustrating an active diode driver circuit for the control of MOSFET turn-on according to an exemplary embodiment of the present invention; and FIG. 7 is a diagram illustrating MOSFET soft turn-on performed by the circuit in FIG. 6.

When controlling the turn-on of the switch, an active diode driver first controls the soft turn-on and secondly controls the hard turn-on. More specifically, the active diode driver first controls the soft turn-on of the switch when a voltage between the opposite ends of the parasitic diode of the switch (VKA) is close to zero, and secondly controls the hard turn-on of the switch when the VKA reaches zero, which will be specifically described below through exemplary embodiments thereof.

As illustrated in FIG. 6, an M1 turn-on controller, which is the active diode driver, includes a zero cross detector (ZCD) 100 that detects a point in time when a voltage between the opposite ends K and A (VKA) becomes zero, as the existing active diode circuit does; and further includes a near zero-cross detector (NZCD) 200. The NZCD 200 generates an output signal when the VKA is close to zero. The NZCD 200 generates SDRV; and the ZCD 100 generates HDRV. Here, the SDRV is a signal for softly turning on the switch M1, and the HDRV is a signal for fully turning on the M1.

Figure 1:
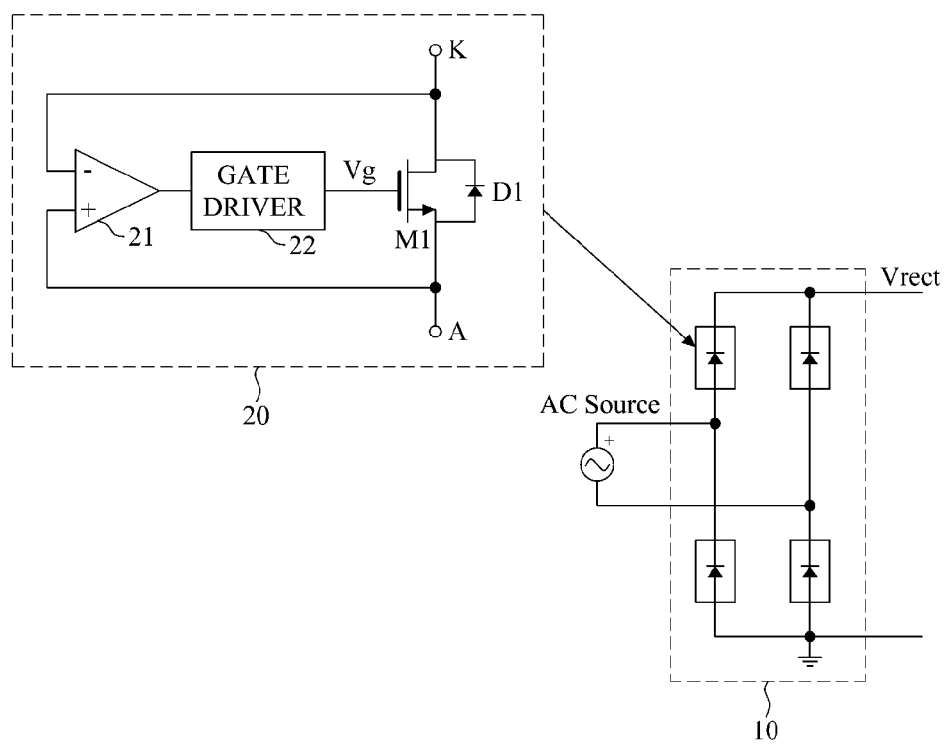
FIG. 1 is a diagram illustrating a circuit of an active rectifier using a conventional active diode.
Figure 2:
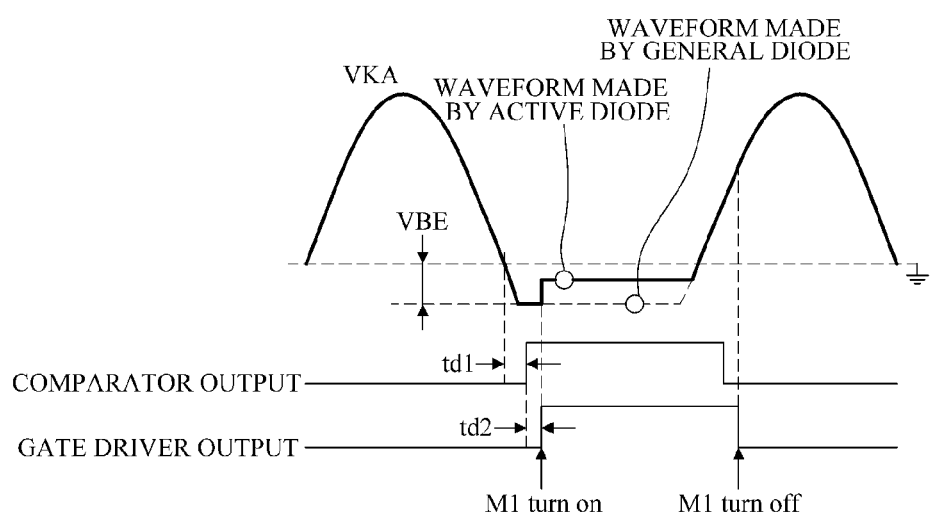
FIG. 2 is a waveform diagram illustrating an operation when the active diode in FIG. 1 operates.
Figure 3:
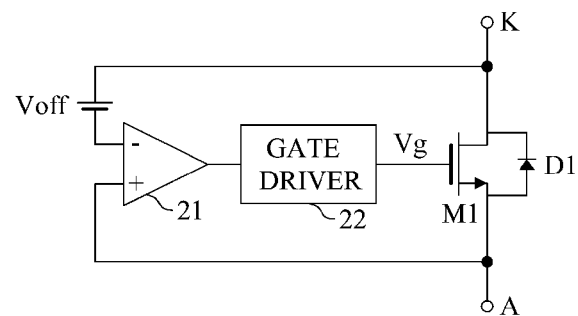
FIG. 3 is a diagram illustrating an active diode performing a turn-on delay compensation using offset.
Figure 4:
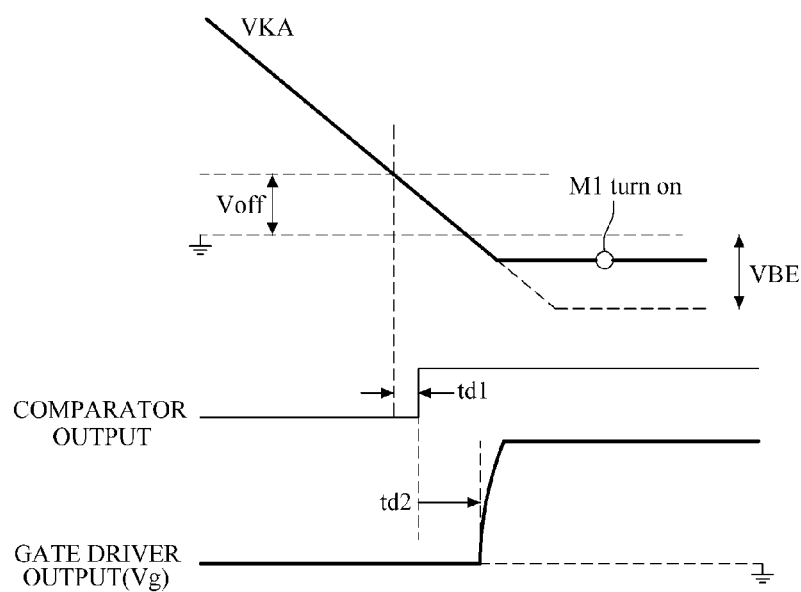
FIG. 4 is a diagram illustrating an operation waveform in the case the delay compensation using offset is performed.

FIG. 7 illustrates an operation of a circuit illustrated in FIG. 6. If a VKA becomes lower than VT, which is a trigger voltage of a NZCD 200, an SDRV signal is generated after the delay of the NZCD 200. Such an SDRV signal and a gate driver 300 softly turn on an M1. When being softly turned-on, the M1 operates on the lower voltage than the voltage when the gate voltage is fully turned-on so that the M1 operates in the state in which Rdson is high. Thus, during such a period, the loss may be increased more than the one when the M1 being fully turned-on, but the loss is reduced than the one when only diode D1 operates. Then, if the VKA becomes lower than zero, the ZCD 100 generates a HDRV signal, and then after the delay of the gate driver 300, the M1 is turned-on. Accordingly, in the existing manner, while the diode is on, the M1 is turned-on so that the width of the VKA being changed is large; however, in the manner using FIG. 6, the VKA is more softly changed compared to the existing manner so as to reduce the EMI. In addition, the conduction loss is reduced compared to FIG. 2.

Figure 8:
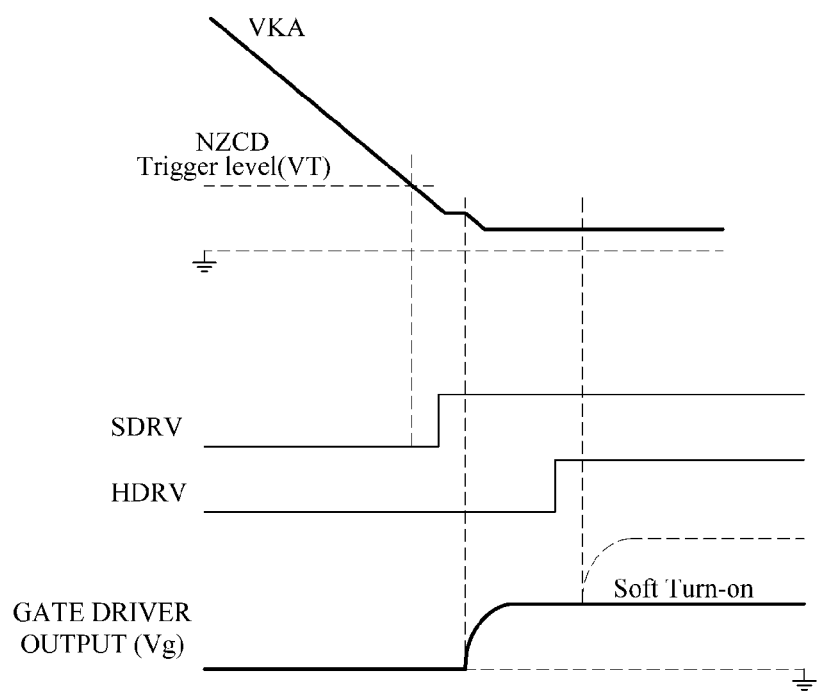
FIG. 8 is a diagram illustrating an operation for restraining the generation of an excessive reverse-current in the circuits in FIG. 6.

FIG. 8 is a diagram illustrating an operation for restraining the generation of an excessive reverse-current in the circuits in FIG. 6.

Figure 5:
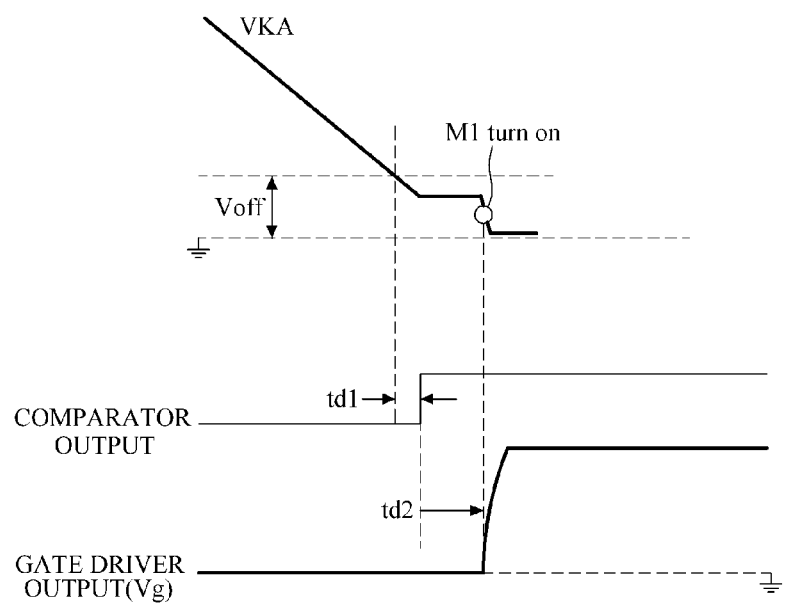
FIG. 5 is a diagram illustrating a phenomenon that a hard turn-on of M1 is performed when VKA is greater than 0 and lower than Voff.

FIG. 8 illustrates an operation for retraining the generation of an excessive reverse-current by M1 only being softly turned-on when a VKA is greater than zero voltage and lower than VT. The VKA is the value between the VT and 0V, an NZCD 200 performs the soft turn-on. However, since an output of a ZCD 100 is not generated, the full turn-on as illustrated in FIG. 5 is not performed. Since Rdson is comparatively high when M1 is softly turned-on, a reverse turn-on current lower than the one in FIG. 5 is generated. Thus, unnecessary loss is reduced, and EMI is also reduced.

Figure 9:
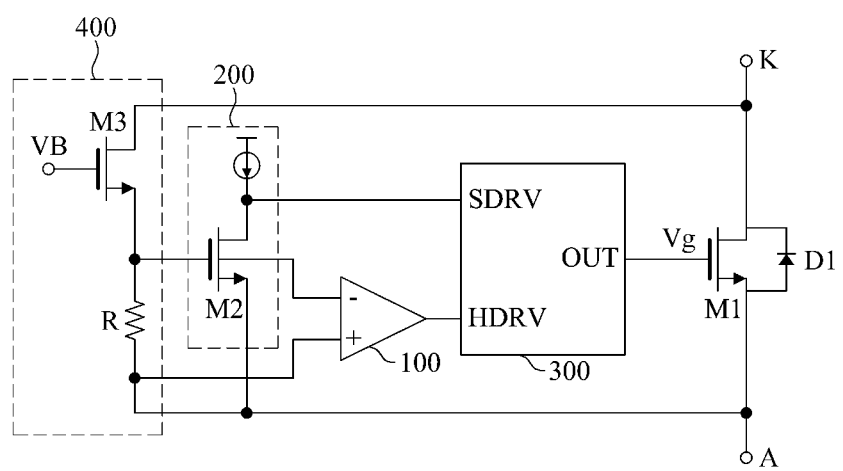
FIG. 9 is a diagram illustrating the detailed example of FIG. 6.

FIG. 9 is a diagram illustrating the detailed example of FIG. 6.

A circuit that is implemented including a NZCD 200 is as FIG. 9. In the case an M3 is always on and a VKA is greater than VB-VT, the maximum voltage of source of an M3 is clamped to VB-VT. If the VKA becomes smaller than VB-VT, the source voltage of the M3 becomes almost the same as the VKA. When a threshold voltage of a second switch M2 is VT, and the gate voltage of the M2 is lower than the VT, the M2 is turned off so as to increase the drain voltage of the M2 to generate an SDRV signal. The numeral reference 400 is a constitution of a switch voltage sense.

Figure 10:
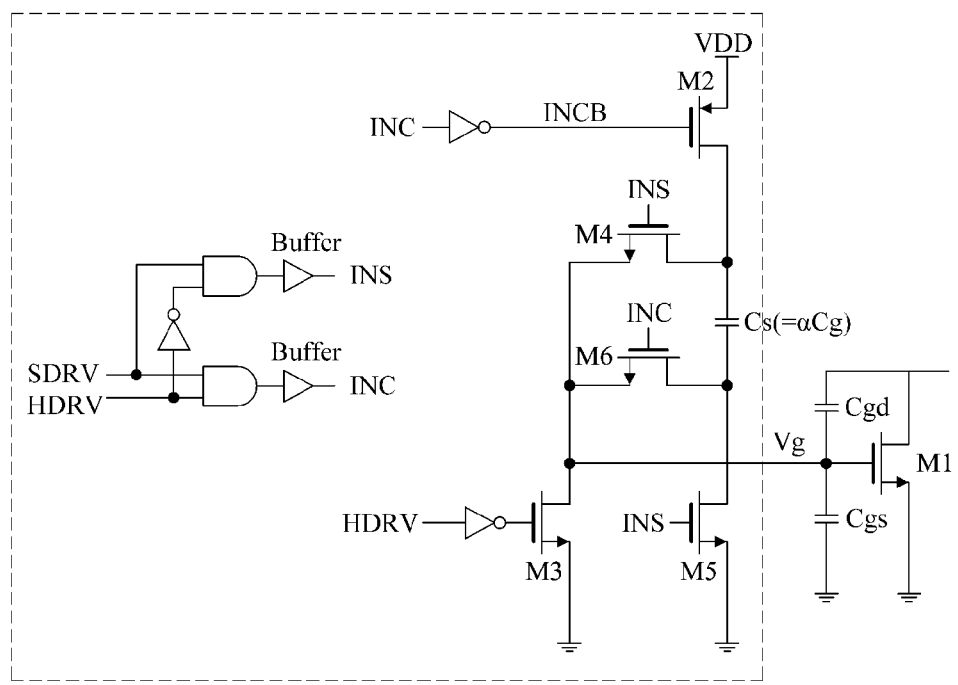
FIG. 10 is a diagram illustrating a gate driver according to an exemplary embodiment.
Figure 11:
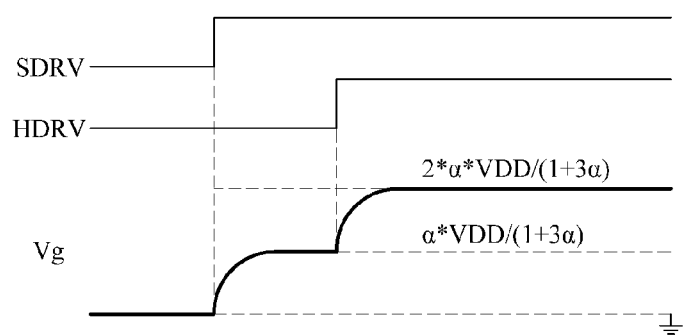
FIG. 11 is a diagram illustrating an operation waveform of the gate driver illustrated in FIG. 10.

FIG. 10 is a diagram illustrating a gate driver according to an exemplary embodiment; and FIG. 11 is a diagram illustrating an operation waveform of the gate driver illustrated in FIG. 10.

FIG. 10 is a diagram illustrating a gate operation circuit that is operable in dual steps, such as soft turn-on and full turn-on. When an SDRV is high and a HDRV is low, M1 is in a soft operation state, and then voltage Vg is increased with the voltage that has been charged in capacitor Cs. If the SDRV and the HDRV is both high, the M2 is turned-on and is provided with additional charges from VDD so that the voltage Vg is additionally increased. The Cg indicates Cgs+Cgd and is a*Cg. The gate voltage when M1 is softly turned-on is as the following Equation 1.

$$\frac{\alpha}{1+3\alpha} \cdot VDD \quad \text{Equation 1}$$

The gate voltage when M1 being fully turned-on is as the following Equation 2.

$$\frac{2\alpha}{1+3\alpha} \cdot VDD \quad \text{Equation 2}$$

Figure 12:
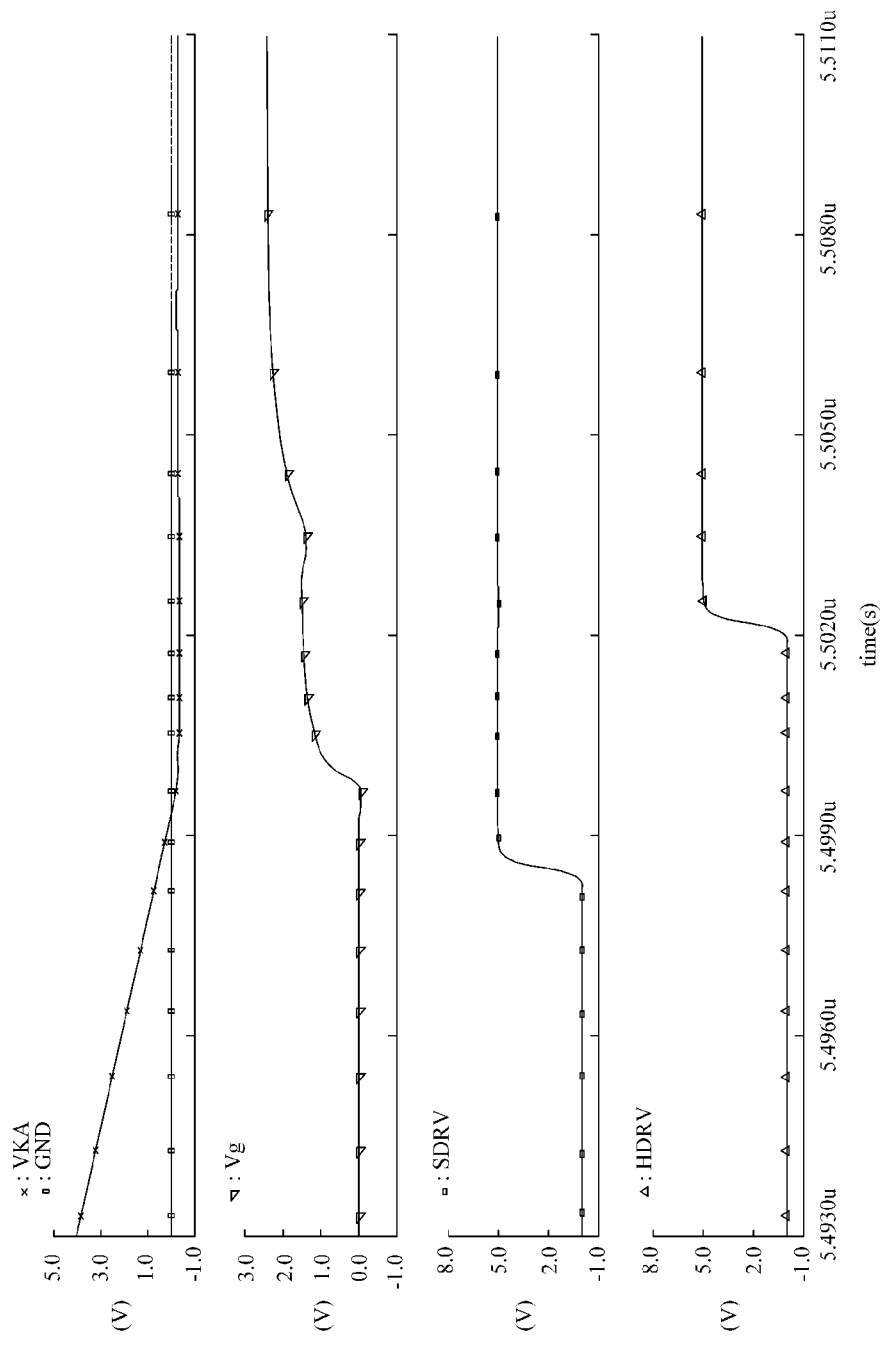
FIG. 12 is a diagram illustrating a simulation result of a circuit illustrated in FIG. 9.
Figure 13:
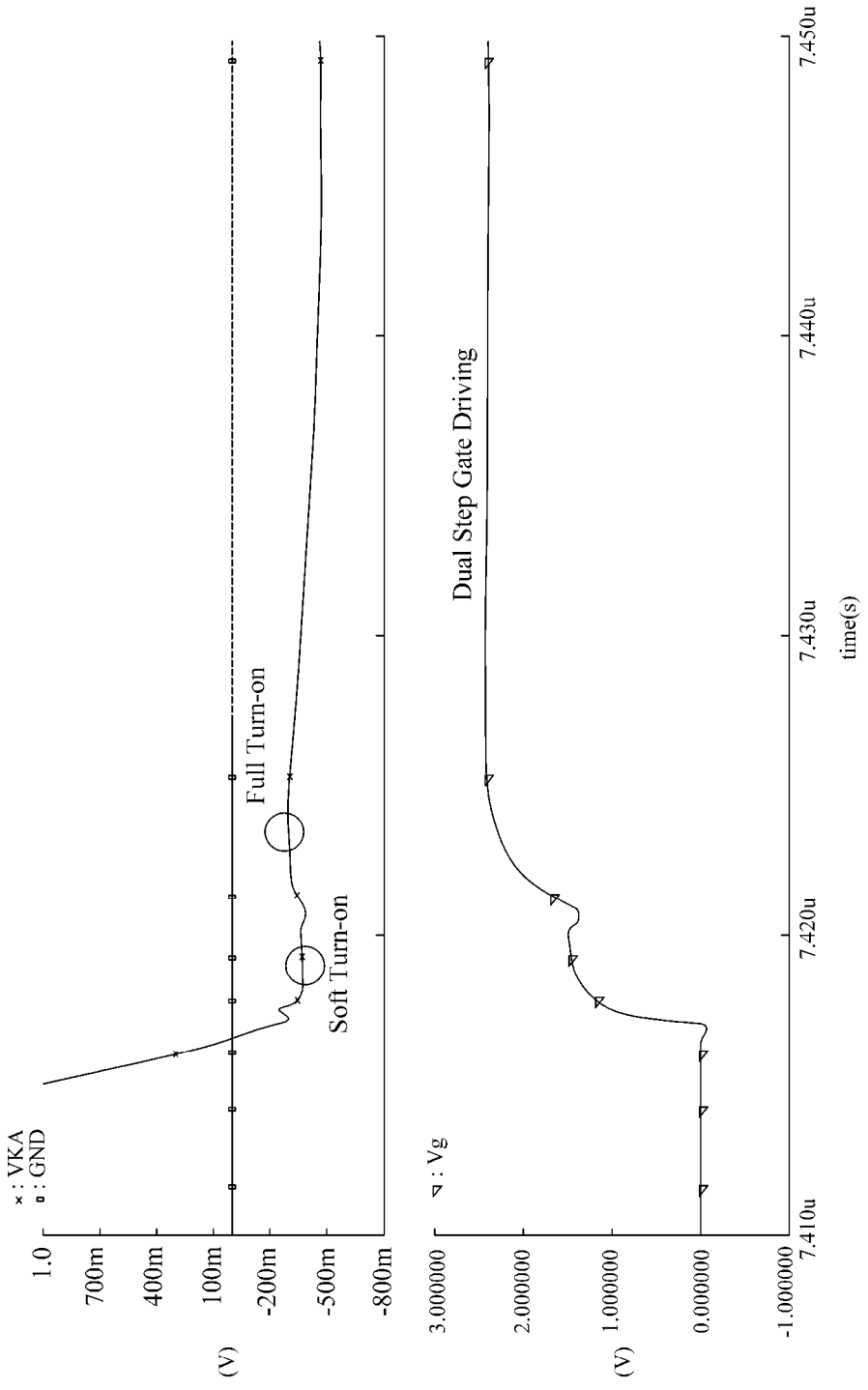
FIG. 13 is an enlarged diagram illustrating VKA and Vg waveforms at a point in time when an M1 is turned-on in the simulation waveform in FIG. 12.

FIG. 12 is a diagram illustrating a simulation result of a circuit illustrated in FIG. 9; and FIG. 13 is an enlarged diagram of a point in time when an M1 is turned-on in a simulation waveform in FIG. 12.

FIG. 12 illustrates each simulation waveform of VKA, Vg, SDRV, and HDRV; and FIG. 13 is an enlarged diagram illustrating VKA and Vg waveforms at a point in time when an M1 is turned-on. As illustrated in FIGS. 12 and 13, the gate voltages are controlled in dual steps, and the VKA voltage is controlled to be softly changed below 0V.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

The invention claimed is:

1. An active diode driver for operating a switch of an active rectifier switch using an active diode, wherein the active diode driver is configured to first control a soft turn-on of the switch and secondly a hard turn-on of the switch, wherein the active diode driver is configured to, in response to a voltage between opposite ends of a parasitic diode of the switch being close to zero, first control a soft turn-on of the switch, and in response to the voltage of the opposite ends of the parasitic diode reaching zero, secondly control a hard turn-on of the switch.

2. The active diode driver of claim 1, comprising:
a near zero cross detector (NZCD) configured to generate an output signal when the voltage between the opposite ends of the parasitic diode of the switch is close to zero;
a zero cross detector (ZCD) configured to generate an output signal by detecting a point in time when the voltage of the opposite ends of the parasitic diode becomes zero; and
a gate driver configured to, in response to receiving the output signal from the NZCD, control the soft turn-on of the switch, and then in response to additionally receiving the output signal from the ZCD, control the hard turn-on of the switch.

3. The active diode driver of claim 2, wherein the NZCD is configured to generate the output signal when the voltage between the opposite ends of the parasitic diode is lower than a trigger voltage of the NZCD.

4. The active diode driver of claim 3, wherein the NZCD comprises a second switch configured to, in response to a threshold voltage being a same as the trigger voltage and a gate voltage being lower than the threshold voltage, be turned off so as to increase a drain voltage and generate the output signal.

* * * * *